United States Patent [19]

Asmussen et al.

[11] Patent Number: 4,656,119

[45] Date of Patent: Apr. 7, 1987

[54] METHOD OF MANUFACTURING X-RAY RESIST

[75] Inventors: Frithjof Asmussen, Berlin; Wolfgang Gaenzler, Darmstadt; Winfried Wunderlich, Rossdorf, all of Fed. Rep. of Germany

[73] Assignees: Rohm GmbH Chemische Fabrik, Darmstadt; Max-Planck-Gesellschaft Zur Foerderund der Wissenschaften, Goettingen, both of Fed. Rep. of Germany

[21] Appl. No.: 802,450

[22] Filed: Nov. 27, 1985

[30] Foreign Application Priority Data

Dec. 18, 1984 [DE] Fed. Rep. of Germany ....... 3446074

[51] Int. Cl.$^4$ ............................................. G03C 5/00
[52] U.S. Cl. .................................. 430/327; 430/325; 430/330; 430/967
[58] Field of Search ................ 430/327, 967, 330, 325

[56] References Cited

U.S. PATENT DOCUMENTS 4,415,653  11/1983  Lai et al. ............................ 430/327
4,430,419  2/1984  Harada et al. ...................... 430/327

FOREIGN PATENT DOCUMENTS 0064864  11/1982  European Pat. Off. .

Primary Examiner—Jack P. Brammer
Attorney, Agent, or Firm—Oblon, Fisher, Spivak, McClelland & Maier

[57] ABSTRACT

A method of producing X-ray resist with etching patterns, using known supports which are coated with a film comprised of copolymers of methacrylonitrile and methacrylic acid is disclosed. This method uses the following protocol.

(a) A copolymer of methacrylonitrile and methacrylic acid with molecular weight <700,000 is used for coating the support.
(b) Before X-ray irradiation, the film is thermally treated at temperatures below 150° C. until a solvent-free, uncrosslinked film is obtained.
(c) After the X-ray irradiation, the film is tempered for 15-30 min at temperatures in the range 140°-170° C.
(d) And subsequently the film is developed with a solvent system L comprised of water and/or an organic solvent which contains oxygen in the form of a hydroxyl group and/or an ether group and/or an ester group.

9 Claims, No Drawings

METHOD OF MANUFACTURING X-RAY RESIST

BACKGROUND OF THE INVENTION

1. Field of the Invention

The invention relates to a method of manufacturing X-ray resist based on copolymers of methacrylonitrile and methacrylic acid.

2. Discussion of the Background

Resists are used in manufacturing semiconductor elements. Their use is based, in general, on the fact that zones of differing solubility are developed on relatively thin polymer layers upon irradiation with energetic radiation, such as X-rays. Using this technique, high precision can be obtained on a submicron scale. This phenomenon can be exploited to either increase solubility under the action of specific solvents (positive resist) or reduced solubility (negative resist). A reduction of the solubility of the polymer material may be based primarily on cross-linking reactions.

Copolymers of methacrylic acid and methacrylonitrile are known as materials for electronbeam positive resist (see European OS No. 64 864). Such resists have high sensitivity and high plasma etching resistance. To produce them, a supporting substrate, which as a rule is a surface-oxidized silicon wafer, is coated with a polymer solution of the resist material to form a resist film about 0.7 micron thick. The resist film is then tempered in air (at 30–40% humidity) at 160° C. for ½ hr. This is followed by exposure to the electron beam treatment and development by an organic solvent; methyl cellosolve (2-methoxyethanol). A refinement of this is presented in European OS No. 81 633, where the coating comprised of the methacrylic acid/methacrylonitrile copolymer in an organic solvent-diglyme, (1,1'-oxybis(2-methoxyethane) is produced by centrifugal coating (spin coating). The first temperature regime should be at 120°–140° C. for 10–30 min. The second at 140°–150° C. for another 10–30 min. The irradiation is with UV light. As developers, methanol, ethanol, aqueous ethanol, and aqueous acetone may be used. For highly resolved polymer patterns, aqueous ethanol is recommended.

In various other publications, copolymers of methacrylic acid with methacrylonitrile, generally together with methacrylic acid esters (such as methyl methacrylate) or with isobutylene are recommended as resists for energetic radiation (see Japanese OSs No. 78-81,114, 81-544,434, 81-53,114, 79-88,117, 77-31,029 and 78-162,297). The particular suitability of copolymers made of methacrylic acid and methacrylonitrile for forming dimethylglutarimide units is described in U.S. Pat. No. 3,964,908. The high resolution, high glass transition temperature and good heat stability of resists based on this copolymer are noted in that patent document. See also Hiraoka H., Welsh, L. W., and Bargon, J., 1981, *J. Electrochem. Soc.*, May:1065.

In many respects, polymers based on methacrylic acid/methacrylonitrile copolymers meet the technical requirements for a polymeric substrate (film material) for resist purposes. The technical requirements applicable when this class of polymers is employed for X-ray lithography are, however, in some respects different. The procedure is generally based on the technology described above, but it has been found that the temperature program analogous to European OS No. 81 633 does not lead to optimal results. Further, the development of the resist mask has been found lacking and in need of improvement.

There is therefore a strongly felt need for a methacrylic acid/methacrylonitrile copolymer-based resist material which does not suffer the drawbacks suffered by existing technology.

SUMMARY OF THE INVENTION

Accordingly, it is an object of this invention to provide a method for producing X-ray resist which result in etch patterns having very high resolution.

It is another object of this invention to provide a method for producing X-ray resist which results in etch patterns having very good mechanical stability.

It is another object of this invention to provide a method for producing X-ray resist which results in etch patterns having very high thermal stability.

It is another object of this invention to provide a method for producing X-ray resist in etch patterns having a very high resolution, very good mechanical stability and a very high thermal stability.

It has now been surprisingly discovered that all of the above objects are satisfied by the inventors' discovery of a novel method for producing X-ray positive resist. This novel method provides X-ray positive resist etch patterns of high resolution and very good mechanical and thermal stability. The resist can be produced by using known supports to which a film made of copolymers of methacrylonitrile and methacrylic acid is applied and subjected to X-ray lithography. In this novel method the following protocol is used.

(a) A copolymer of methacrylonitrile and methacrylic acid is employed for coating the support. This copolymer should have a molecular weight less than 700,000.

(b) Prior to the irradiation with X-ray, the coating is subjected to heat treatment at a temperature of less than 150° C., until a solvent-free, uncrosslinked film is obtained.

(c) After the X-ray irradiation, the irradiated film is tempered at a temperature in the range of 140°–170° C., over a period of 15–30 min.

(d) And subsequently, the film is developed with a solvent L comprised of water and/or an organic solvent containing oxygen in the form of a hydroxyl group and/or an ether group and/or an ester group.

DETAILED DESCRIPTION OF THE PREFERRED EMBODIMENTS

Preferably, the organic solvent in the developer contains at least two carbon atoms and does not contain any chemical elements other than carbon, hydrogen and oxygen. Possible such solvents include, in particular, the lower alcohols, e.g., ethanol and propanol (n-propanol or iso-propanol). Cyclic and linear ethers and esters, such as ethoxyethyl acetate, dioxane, and glycol monoethers (particulariy oligo(glycol monoethers), such as diethylene glycol monoether and triethylene glycol monoether). It is advantageous for the organic solvent or solvents to be fully miscible with water. The weight ratio of water to organic solvent is ordinarily in the range of 1:4 to 1:7.

According to the invention, the radiation-sensitive copolymer serves to form images of submicrostructures by X-irradiation, especially for applications with soft X-ray. In this connection, synchrotron radiation is noteworthy as an optimal type of radiation. Because of its high intensity it enjoys the advantages of requiring exposures of only a few seconds, favorable wavelength ($\lambda_p \cong 1$nm) and good collimation.

The Copolymer

The type of polymer which has proved particularly suited also for use as X-ray resist material is a copolymer of methacrylic acid and methacrylonitrile having a molecular weight of less than 700,000, preferably in the range of 200,000 to 500,000. Preferably the copolymer is comprised of methacrylic acid and methacrylonitrile in the ratio of 75:25 to 50:50 wt. %, particularly about 60:40 wt. %. Advantageously the copolymer is prepared as a "substance polymer" (i.e., polymerized without a solvent other than the reactants) (see H. Rauch-Puntigam and Th. Voelker, in "Acrylic and methacrylic compounds" (in German), Springer-Verlag, Heidelberg, 1967).

The initiators employed may be known initiators. For example, per-compounds such as peroxides and per acid derivatives, in the quantities ordinarily used for the purpose, e.g. 0.01 to 0.1 wt. % (based on the weight of the monomers).

The regulators employed may be the applicable known regulators, particularly sulfur-containing regulators such as mercaptans or thio acids, e.g. tert-dodecylthiol. The amounts of regulators employed are in the customary range, e.g. 0.01–0.5 wt. % (based on the weight of the monomers).

Other features of the invention will become apparent in the course of the following description of exemplary embodiments which are given for illustration of the invention and are not intended to be limiting thereof.

Preparation of the Copolymer

The following exemplary method may be used for preparing the copolymer:

EXAMPLE 1

A mixture of 48 parts by wt. methacrylic acid, 32 parts by wt. methacrylonitrile and 20 parts by wt. methoxyethanol was polymerized with the addition of 0.16 parts by wt. of an initiator mixture made up of tert-butyl perpivalate, benzoyl peroxide, and tert-butyl perbenzoate in a weight ratio of 5:2.5:1.5, and also with the addition of 0.16 parts by wt. dodecylthiol as a regulator. The polymerization was carried out at a temperature above room temperature, viz. about 42° C., for 72 hr, to form a hard, glass-like product. The product was then tempered 3 hr at 100° C.

Support and Coating

The usual materials are candidates for the support; e.g., (for semiconductor applications) silicon wafers with oxidized surfaces, chromium coated glass, metals (such as, e.g., aluminum), etc., of dimensions (currently) employed in the art, e.g. diameter 7.5 cm.

The coating may be carried out in known fashion, e.g. from a solution of the copolymer.

Suitable solvents are organic solvents such as partially etherified polyols, particularly 2-methoxyethanol. As a rule, the support material is coated by spin-coating.

Generally the layer thickness of the applied polymer material should not exceed 2 micron. As a rule the thickness is in the range 0.1–2 micron, preferably 1.0±0.2 micron.

Prebaking

Residual solvent in the resist was removed in a prebaking process: 120°–150° C. for 30 min.

Irradiation

To convert the structure of the resist, the coated wafer was irradiated with energetic radiation (synchrotron radiation, which has maximum radiated power at a wavelength of ca. 1 nm) behind a mask which contained the structure information. The dose of radiation was 100 mJ/cm$^2$.

Intermediate Heating

The unirradiated portion of the resist was stabilized by imidation, in an intermediate process (170° C. for 30 min), and was thereby made insoluble.

Development

The irradiated resist was developed in an ethanol-water mixture (ratio 7:1 by wt.) in 30 sec, for a resist thickness of 0.5 micron. The material removed from the masked area was very small (<5%).

Plasma Etching Resistance

Resist which is resistant to plasma etching is required for transferring submicrostructures to the semiconductor. The copolymers of methacrylic acid and methacrylonitrile which are described herein have very good plasma etching resistance, due to their property of forming intra- and intermolecular imides at elevated temperatures. The relative etching rate, $R_{rel}$, in a CF$_4$/O$_2$ (4%) plasma (at 0.5 torr, and 150 W) was 0.4 (based on polymethyl methacrylate=1); cf. 0.5 for "AZ 1350" photo resist.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method of producing X-ray resist with etching patterns, said method comprising:
   (a) using a copolymer of methacrylic acid and methacrylonitrile in a weight ratio of between 75:25 and 50:50 wt. % having a molecular weight less than 700,000 for coating a support to form a film;
   (b) thermally treating the said film at a temperature of 120° C. to 150° C. before X-ray irradiation until a solvent-free uncrosslinked film is obtained;
   (c) exposing said solvent free uncrosslinked film to X-ray irradiation in a desired pattern;
   (d) tempering the said film after the X-ray irradiation for 15–30 min at a temperature in the range of 140°–170° C.; and
   (e) developing the said film with a solvent system L comprising water or an organic solvent which contains oxygen in the form of a hydroxyl group, an ether group or an ester group.

2. The method of claim 1, comprising using a copolymer prepared from methacrylic acid and methacrylonitrile in a weight ratio of about 60:40 wt. %.

3. The method of one of claims 1, comprising using a copolymer having a molecular weight in the range of 200,000 to 500,000.

4. The method of claim 1, comprising conducting the thermal treatment of step (b) for a period of 15–30 min.

5. The method of claim 1, comprising using as the said solvent system L a solvent comprising ethanol and water.

6. The method of claim 1, comprising using as the said solvent system L a solvent comprising iso-propanol and water.

7. The method of claim 1, comprising using as the said solvent system L a solvent comprising 2-methoxyethanol and 2-ethoxyethyl acetate.

8. The method of claim 1, wherein a water to organic solvent weight ratio in the range of 1:4 to 1:7 is used in the said solvent system L.

9. The method of claim 1, wherein the said X-ray irradiation is synchrotron radiation.

* * * * *

UNITED STATES PATENT AND TRADEMARK OFFICE
CERTIFICATE OF CORRECTION

PATENT NO. :     4,656,119
DATED      :     April 7, 1987
INVENTOR(S) :    ASMUSSEN, Frithjof ET AL It is certified that error appears in the above-identified patent and that said Letters Patent is hereby corrected as shown below:

On the Title Page:

THE ASSIGNEE WAS SPELLED INCORRECTLY IN THE LETTERS PATENT.
SHOULD READ:

MAX-PLANCK-GESELLSCHAFT ZUR FOERDERUNG DER WISSENSCHAFTEN

Signed and Sealed this

Twenty-fifth Day of August, 1987

*Attest:*

DONALD J. QUIGG

*Attesting Officer*     *Commissioner of Patents and Trademarks*